United States Patent
Warner et al.

(10) Patent No.: US 7,098,074 B2
(45) Date of Patent: Aug. 29, 2006

(54) MICROELECTRONIC ASSEMBLIES HAVING LOW PROFILE CONNECTIONS

(75) Inventors: Michael Warner, San Jose, CA (US);
Masud Beroz, Livermore, CA (US);
David Light, Los Gatos, CA (US);
Delin Li, San Jose, CA (US); Dennis Castillo, Milpitas, CA (US);
Hung-ming Wang, San Jose, CA (US);
John W. Smith, Horseshoe Bay, TX (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/699,328

(22) Filed: Oct. 31, 2003

(65) Prior Publication Data

US 2004/0219716 A1 Nov. 4, 2004

Related U.S. Application Data

(60) Provisional application No. 60/426,478, filed on Nov. 13, 2002.

(51) Int. Cl.
*H01L 21/44* (2006.01)
*H01L 21/48* (2006.01)
*H01L 21/50* (2006.01)

(52) U.S. Cl. ..................... 438/108; 438/460

(58) Field of Classification Search ............... 438/106, 438/107, 108, 113, 114, 118, 460, 612, 613
See application file for complete search history.

(56) References Cited

U.S. PATENT DOCUMENTS

| | | | |
|---|---|---|---|
| 5,148,265 A | 9/1992 | Khandros et al. | |
| 5,148,266 A | 9/1992 | Khandros et al. | |
| 5,503,286 A * | 4/1996 | Nye et al. ..................... | 216/13 |
| 5,518,964 A | 5/1996 | DiStefano et al. | |
| 5,688,716 A | 11/1997 | DiStefano et al. | |
| 5,798,286 A | 8/1998 | Faraci et al. | |
| 5,830,782 A | 11/1998 | Smith et al. | |
| 5,913,109 A | 6/1999 | Distefano et al. | |
| 6,429,112 B1 | 8/2002 | Smith et al. | |
| 6,924,171 B1 * | 8/2005 | Buchwalter et al. ........ | 438/106 |

FOREIGN PATENT DOCUMENTS

WO   WO 92/05582   4/1992

\* cited by examiner

*Primary Examiner*—Phuc T. Dang
(74) *Attorney, Agent, or Firm*—Lerner, David, Littenberg, Krumholz & Mentlik, LLP

(57) ABSTRACT

A method is disclosed for making a microelectronic package. A material is applied to a first major surface of a microelectronic element to reduce the heights of protrusions projecting from the first major surface. The microelectronic element is assembled to a microelectronic component. A method of forming protrusions and an assembly incorporating the microelectronic element having protrusions is also disclosed.

40 Claims, 12 Drawing Sheets

MICROELECTRONIC ASSEMBLIES HAVING LOW PROFILE CONNECTIONS

CROSS-REFERENCE TO RELATED APPLICATIONS

The present application claims the benefit of U.S. Provisional Application Ser. No. 60/426,478 filed Nov. 13, 2002, the disclosure of which is hereby incorporated by reference herein.

FIELD OF THE INVENTION

The present invention relates to methods of making microelectronic assemblies and to microelectronic assemblies.

BACKGROUND OF THE INVENTION

Microelectronic elements are typically packaged and assembled with a microelectronic component to facilitate connection to external circuitry. Heat is generated in use, as well as during manufacturing operations such as, for example, bonding. When heat is generated within the assembly, the various parts of the assembly expand and contract according to the coefficient of thermal expansion for the particular part. Incorporating various materials having different coefficients of thermal expansion can create stress on certain components within an assembly.

For example, as disclosed in certain embodiments of U.S. Pat. No. 5,518,964, the disclosure of which is hereby incorporated by reference herein, leads extend between a semiconductor chip and another component and are connected to contacts of the semiconductor chip by bonding material. For example, the semiconductor chip is assembled with a connection component, which may incorporate a dielectric body and leads extending on a lower surface of the dielectric body. The leads have a first end that is connected to the contacts and a second end connected to the dielectric body. A dielectric layer is formed around the leads and around the connection between the leads and the contacts. For example, a curable material is introduced between the chip and the dielectric body. The material is cured to form a dielectric layer surrounding the leads. On the upper surface of the dielectric body, the surface facing away from the leads, the dielectric body has terminals for forming connections with other components. For example, the terminals may ultimately be used to connect to conductive features on an external element, such as a circuit board.

During service, or during any operation in which heat is generated, some materials within the assembly have significantly different coefficients of thermal expansion from other materials in the assembly so that some parts expand and contract by different amounts from other parts of the assembly. The dielectric body of the component may comprise polyimide and the semiconductor chip may comprise silicon. These materials have coefficients of thermal expansion that are significantly different, which means that these parts of the assembly experience differing amounts of expansion and contraction for the same temperature change. The dielectric layer and the leads provide the assembly with flexibility so that the terminals move relative to the contacts on the chip. The dielectric layer and leads compensate for different dimensional changes within the assembly. The larger the dielectric layer in the vertical direction, the more movable the terminals and contacts are with respect to one another in the horizontal direction. However, the larger the dielectric layer, the more stress the leads experience. This is compounded by the presence of bonding material between the contacts and the leads, which interferes with the flexibility of the dielectric layer. For connections that do not add to the vertical height between the lead and the contact, the foregoing effect is minimal. However, some connections incorporate a significant amount of bonding material, which adds to the height of the connection between the leads and contacts, and impacts the reliability of the assembly.

Improvements to reduce stress on the conductive elements of a microelectronic assembly and improve the reliability of such assemblies are desirable.

SUMMARY OF THE INVENTION

In one aspect of the present invention, a method of making a microelectronic assembly comprises providing a microelectronic element having a first major surface with protrusions projecting from the first major surface, covering the first major surface and the protrusions with a material, removing a portion of the material so that portions of the protrusions are accessible, and assembling the microelectronic element with a microelectronic component. The material applied to the first major surface reduces the height of the projections. In certain embodiments, the protrusions comprise bumps and the material allows the assembly to behave, in certain respects, as if bumps having a lower height were provided on the first major surface. The protrusions desirably comprise a solder, such as high lead solder, C4 solder or eutectic solder.

In certain preferred embodiments, the protrusions of the microelectronic element are interconnected with conductive elements of the microelectronic component. In certain preferred embodiments, a dielectric layer is formed so as to extend between the microelectronic component and the microelectronic element and so that the leads are embedded in the dielectric layer. The material applied to the first major surface reduces the height of the projections so that the dielectric layer incorporates less of the projections and interferes less with the ability of the dielectric layer to adapt to dimensional changes within the assembly.

In certain preferred embodiments, the microelectronic component comprises a base layer and the conductive elements comprise leads. Each of the leads has a first end and a second end. The first ends of the leads are connected to the microelectronic components adjacent a lower surface of the base layer. The step of interconnecting comprises bonding the second ends of the leads to the protrusions of the microelectronic element. In certain preferred embodiments, the leads are deformed so that the leads extend between the microelectronic element and the microelectronic component.

In certain preferred embodiments, the step of forming a dielectric layer includes introducing a flowable material between the microelectronic component and the microelectronic element. The coefficient of thermal expansion ("CTE") for the material is preferably closer in value to the coefficient of thermal expansion of the microelectronic element than the coefficient of thermal expansion for the dielectric layer. More preferably, the CTE for the material is about the same as the CTE for the microelectronic element.

In certain preferred embodiments, the microelectronic component has conductive elements comprising leads, and further comprises deforming the leads so that the leads are brought into engagement with the protrusions.

The protrusions on the microelectronic element may comprise bumps of bonding material. The material applied to the first major surface may comprise an epoxy. In certain preferred embodiments, the material has a low coefficient of thermal expansion. The protrusions preferably project from the material a distance of about 50 μm or less.

In certain preferred embodiments, the step of covering the first major surface and the protrusions comprises disposing the microelectronic element in the recess of a mold tool so that the first major surface is disposed in the recess. The material is disposed in the recess so as to cover the first major surface. The recess of the mold tool may be defined by a base, a wall extending from the base, and an open side.

In certain preferred embodiments, the mold tool has at least one protruding member extending from the base into the recess. The at least one protruding member is spaced from the wall. The at least one protruding member defines an inner region within the recess and the first major surface is disposed in the inner region.

After disposing the microelectronic element in the recess, the material is disposed in the recess so that the first major surface and the protrusions are covered by the material. In embodiments in which the mold tool comprises at least one protruding member, the material is disposed in the recess so that, after removing the mold tool, the at least one protruding, member leaves at least one groove in the material.

The material may be applied to the first major surface as a flowable, curable material and cured to a relatively rigid material. The portion of the material may be removed by grinding or etching.

In certain preferred embodiments, the step of removing a portion of the material includes removing a portion of the protrusions. A portion of the material may be removed so as to form a surface of material incorporating at least one surface of the protrusions. A portion of the material may be removed so that a portion of the protrusions project from the material. A portion of the protrusions may then be removed.

In certain preferred embodiments, the protrusions may be connected to conductive elements of the microelectronic component. A dielectric layer may be formed over the first major surface so as to surround the conductive elements. The coefficient of thermal expansion of the material is preferably closer in value to the coefficient of thermal expansion of the microelectronic element than the coefficient of thermal expansion of the dielectric layer.

In another aspect, a method of forming protrusions on a microelectronic element comprises providing a semiconductor chip having a first major surface and contacts exposed at the first major surface, and forming protrusions including applying a first conductive layer over the contacts, and applying a second conductive layer on the first conductive layer. The protrusions project 50 μm or less from the first major surface.

In certain preferred embodiments, at least one of the first conductive layer and second conductive layer comprises bonding material. The first conductive layer may comprise a high lead solder and the second conductive layer may comprise eutectic solder. The first conductive layer may comprise an alloy including lead and tin.

The step of applying a second conductive layer may comprise dipping.

In certain preferred embodiments, the first conductive layer has a height between about 5 μm and about 25 μm and the second conductive layer has a height between about 10 μm and about 25 μm.

In certain preferred embodiments, a third conductive layer is applied on the second conductive layer. In certain preferred embodiments, the first conductive layer preferably comprises a high lead solder, the second conductive layer comprises lead and the third conductive layer comprises tin. The first conductive layer, second conductive layer and third conductive layer are preferably reflowed to form a protrusion having a core and an outer layer. The core may comprise a high lead alloy and the outer layer comprising an eutectic layer.

An initial layer may be applied on at least a portion of the first major surface so that the initial layer is in contact with the contacts, before the step of applying the first conductive layer. The initial layer desirably comprises at least one metal selected from the group consisting of chromium, copper, titanium, nickel, gold, and alloys of chromium, copper, titanium, nickel and gold.

The method of forming protrusions may be used in a method of forming a microelectronic assembly by providing a connection component having conductive elements, interconnecting the protrusions with the conductive elements, and forming a dielectric layer extending between the microelectronic component and the microelectronic element so that the protrusions and the conductive elements are at least partially embedded in the dielectric layer.

In a further aspect of the present invention, a semiconductor chip assembly has a semiconductor chip with a first major surface and protrusions projecting from the first major surface a distance of less than about 50 μm, and a dielectric layer overlying the first major surface and having conductive elements extending through the dielectric layer and being connected to the protrusions. The dielectric layer may comprise a compliant material and the conductive elements may comprise leads. Assemblies according to this aspect subject the leads to lower stresses due to dimensional changes within the assembly.

The protrusions desirably comprise a solder, such as high lead solder, C4 solder and eutectic solder.

In certain preferred embodiments, the protrusions have, a core and an outer layer. The core desirably comprises a high lead alloy and the outer layer desirably comprises a eutectic layer.

A base layer may overlie the dielectric layer and form an upper surface of the package.

In certain preferred embodiments, the assembly includes a material overlying the semiconductor chip and forming the first major surface. The coefficient of thermal expansion of the material is closer in value to the coefficient of thermal expansion of the semiconductor chip than the coefficient of thermal expansion of the dielectric layer. The material may have grooves lying outwardly of peripheral edges of the semiconductor chip.

The dielectric layer desirably has a thickness of between about 100 μm and about 200 μm. The projections desirably project from the first major surface a distance between about 10 μm and about 50 μm. The particular dimensions are not essential to the invention. In preferred embodiments, an assembly has a dielectric layer with a thickness in the aforementioned range, projections which project from the first major surface in the aforementioned range, and conductive elements extending through the dielectric layer, so that the stress on the conductive elements is low.

BRIEF DESCRIPTION OF THE DRAWINGS

These and other features, aspects, and advantages of the present invention will become better understood with regard to the following description, appended claims and accompanying drawings where:

DETAILED DESCRIPTION

Figure 1:
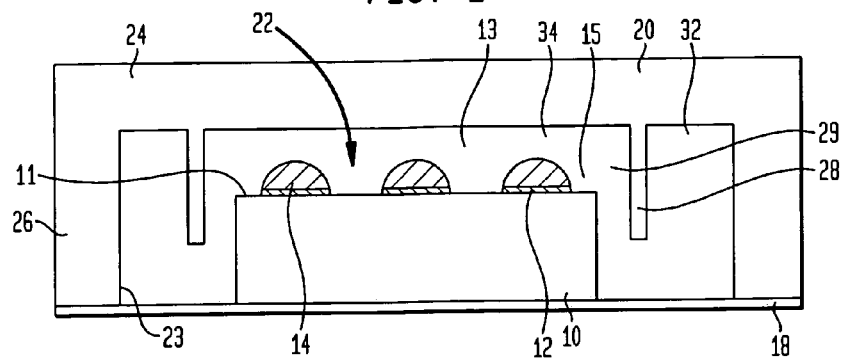
FIG. 1 is a cross-sectional view of a microelectronic element and a mold in a method in accordance with an embodiment of the invention.

The method of forming a microelectronic assembly in accordance with one embodiment of the invention is shown in FIGS. 1–9. As shown in FIG. 1, the microelectronic element 10 has a first surface 11 with a plurality of conductive features including contacts 12 exposed at the first surface. The microelectronic element 10 has a central region 13 lying inwardly of a peripheral region 15. In the cross-sectional view of FIG. 1, only three contacts 12 are shown. However, typically a microelectronic element 10 has many contacts that are arranged on the first surface 11 in the central region 13, or in the peripheral region 15 of the microelectronic element 10, or both. The arrangement of the contacts on the microelement element 10 is not critical to the invention.

The conductive features also include, in certain embodiments, protrusions, such as masses of bonding material, such as solder. The protrusions may comprise bumps or posts or other members attached to the contacts 12. The protrusions 14 comprise conductive material, such as metal or conductive polymer, attached to the contacts 12.

The microelectronic element is placed upon or engaged by a support 18. The support 18 has a surface for supporting the microelectronic element 10. The support 18 may also comprise a platen or other device for engaging the microelectronic element 10. A mold 20 having a recess 22 is arranged with the microelectronic element 10 so that the first surface 11 is disposed within the recess 22. In the embodiment shown in FIG. 1, the mold 20 has a base 24 and at least one wall 26 arranged with the base 24 so as to form the recess 22. The recess has an open side 23 for receiving the first surface 11 of the microelectronic element 10. For example, the wall 26 may comprise a member attached to the peripheral edges of base 24 to form recess 22. The mold 20 and the recess may have a variety of regular or irregular shapes, such as any polygon, oval or circle.

In a preferred embodiment, the mold 20 includes at least one protruding member 28. For example, the protruding member 28 may extend from the wall 26 and protrude into the recess 22. The protruding member 28 shown in FIG. 1 is spaced from the wall 26 so as to form an outer region 32 and an inner region 34 in the recess 22. The mold 20 is arranged with the microelectronic element so the first surface 11 is received in the inner region 34 of the recess 22. The protruding member 28 may comprise a plurality of members arranged adjacent one side or a plurality of sides of the wall 26. The protruding member 28 may also comprise a partition attached to or integral with the base 24, and having an open side 29 for receiving the first surface 11.

Figure 2:
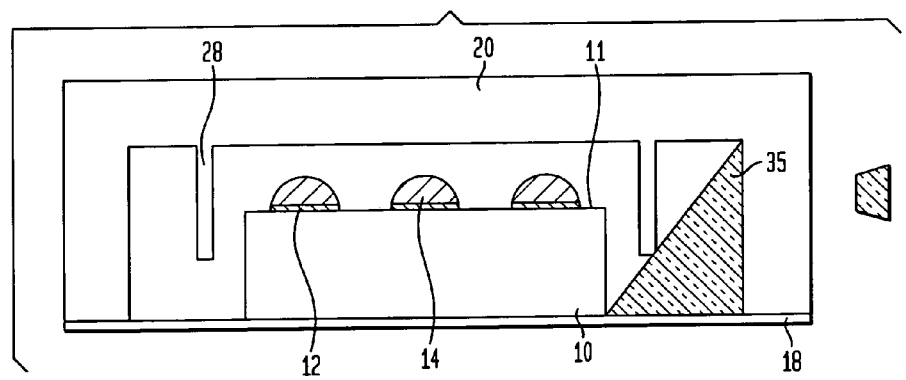
FIG. 2 is the cross-sectional view of FIG. 1, at a later stage in a method in accordance with the embodiment of FIG. 1.
Figure 3:
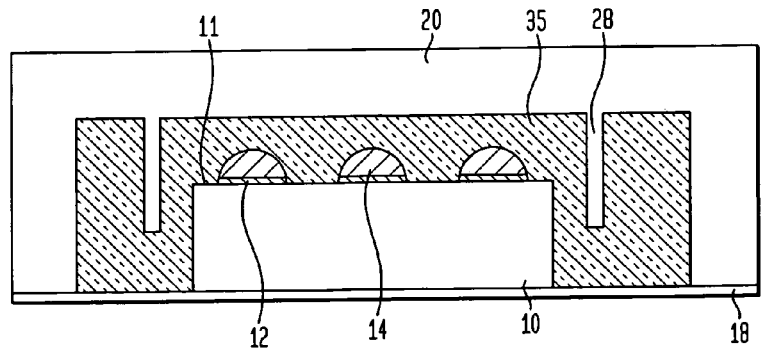
FIG. 3 is the cross-sectional view of FIG. 2, at a later stage in a method in accordance with the embodiment of FIGS. 1 and 2.
Figure 4:
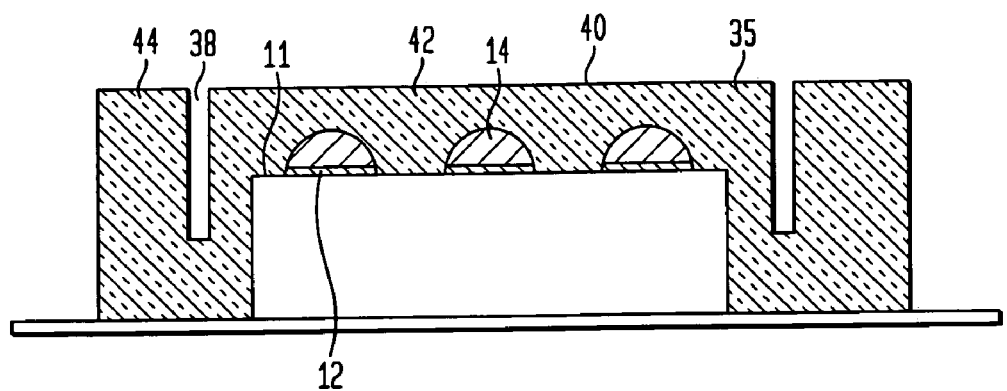
FIG. 4 is the cross-sectional view of FIG. 3, at a later stage in a method in accordance with the embodiment of FIGS. 1–3.

As shown in FIGS. 2 and 3, a flowable material 35 is introduced into the recess 22 so as to cover the first surface 11 of the microelectronic element. The material 35 may comprise a curable material that is cured after being applied over the first surface 11. In embodiments using a mold 20 with one or more protruding members 28, the molding material 35 has at least one channel 38 that is left by the one or more protruding members 28, after the mold is removed. The microelectronic element 10 is covered by the molding material 35, at least so as to cover the first surface 11, and may be embedded in the molding material 35. The molding material 35 has a first portion 42 adjacent the microelectronic element 10 and a second portion 44 located on the other side of the channel 38, as shown in FIG. 4. The molding material 35 has a first top surface 40 overlying the first surface 11 of the microelectronic element.

Figure 5:
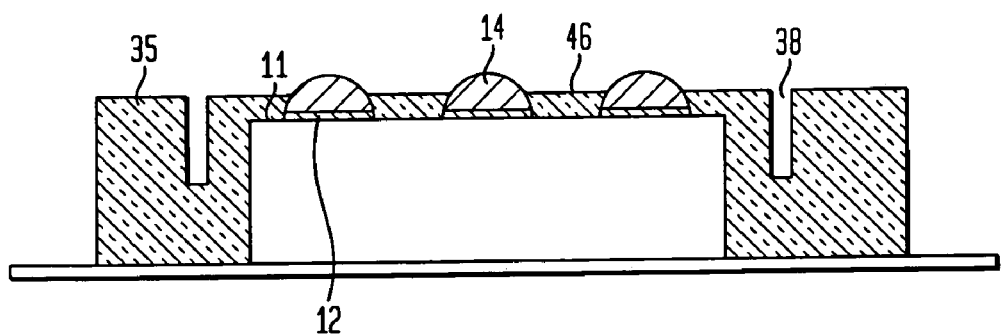
FIG. 5 is the cross-sectional view of FIG. 4, at a later stage in a method in accordance with the embodiment of FIGS. 1–4.

A portion of the molding material 35 is removed to reveal at least a portion of the protrusions 14 on the microelectronic element 10. Removing a portion of the molding material 35 removes the first top surface 40 and forms a second top surface 46 of molding material 35 overlying the first surface 11 of the microelectronic element 10. The second top surface 46 is located between the upper-most end of the protrusions 14 and the first surface 11, as shown in FIG. 5.

Figure 6:
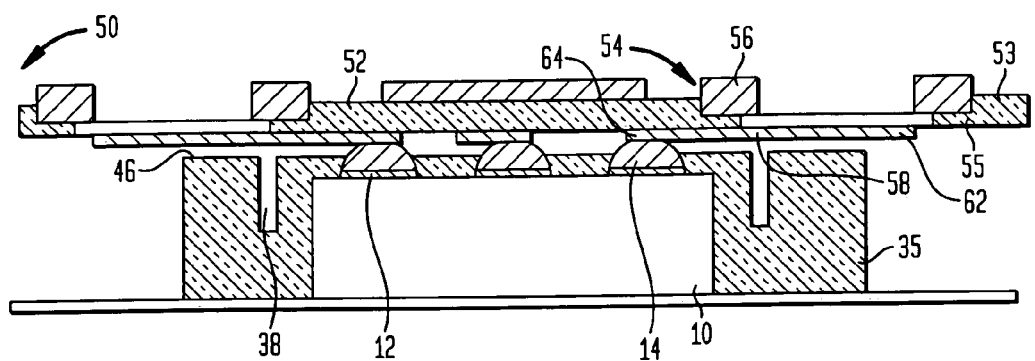
FIG. 6 is the cross-sectional view of FIG. 5, at a later stage in a method in accordance with the embodiment of FIGS. 1–5.

The microelectronic element 10 is assembled with a microelectronic component 50, is shown in FIG. 6. The microelectronic component 50 has a base layer 52 incorporating a plurality of conductive elements 54. The base layer 52 comprises a layer of dielectric material. The base layer 52 desirably includes terminal structures 56 accessible at an upper side 53 of the base layer 52. In certain embodiments, the terminal structures comprise vias extending through the base layer 52 and the vias incorporate conductive material. The conductive elements 54 comprise leads 58 electrically connected to the terminal structures 56 at the lower side 55 of the base layer 52. Each lead 58 has a first end 62 connected to the terminal structures 56 and a second end 64 releasably attached to the lower side 55 of the base layer 52. An elongated portion of the lead extends from the first end 62 to the second end 64. The microelectronic component 50 is arranged with the microelectronic element 10 so that the lower side 55 and the leads 58 face the second top surface 46 of the molding material 35 and the protrusions 14 on the microelectronic element.

Figure 7:
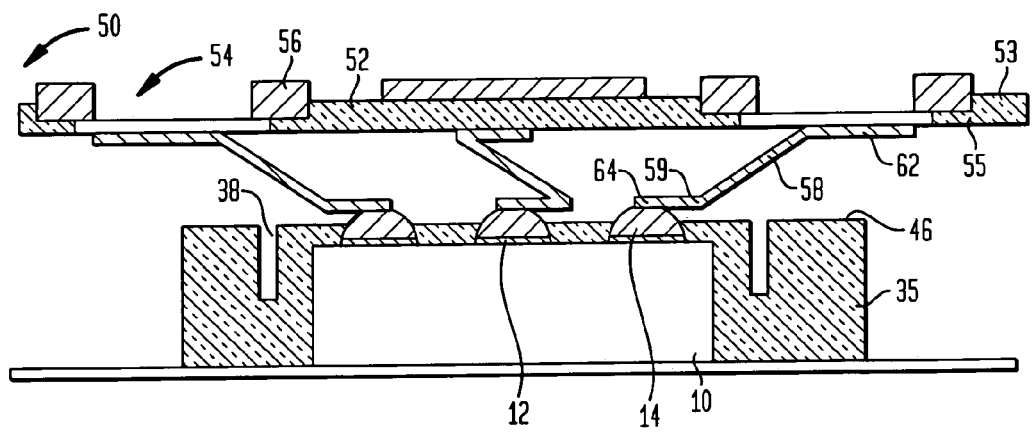
FIG. 7 is the cross-sectional view of FIG. 6, at a later stage in a method in accordance with the embodiment of FIGS. 1–6.

The second ends 64 of the leads 58 are attached to the contacts 12 by bonding the second ends 64 to the contacts 12. Where the protrusions 14 comprise bonding material, the protrusions 14 are used to bond the second ends 64 to the contacts by reflowing the bonding material. In other embodiments, bonding material is added to the protrusions 14 or the second ends 64, or the conductive elements 54 are otherwise connected to the protrusions. For example, ultrasonic, thermal, or other energy may be used to bond the conductive elements 54 to the protrusions 14. In a preferred embodiment, the microelectronic component 50 and microelectronic element 10 are moved with respect to one another, after bonding, so that the leads 58 are deformed and extend in a vertical direction between the microelectronic component 50 and microelectronic element 10. As shown in FIG. 7, the leads 58 extend from the lower side 55 of the microelectronic component 50 to the protrusions 14 on the microelectronic element 10. After the leads 58 are deformed, each lead has a region 59 adjacent the second end 64 that is somewhat bent. Each lead 58 also has a region adjacent the first ends 62 that are also bent.

A dielectric layer 65 is formed between the microelectronic component 50 and the microelectronic element 10 so as to surround the leads 58 and the connection 63 between the second ends 64 and the protrusions 14. For example, a flowable material may be injected or otherwise disposed between the microelectronic component 50 and microelectronic element 10. The flowable material may comprise a curable material, which is cured to form the dielectric layer 65. The dielectric layer 65 may comprise a polymeric material and, in certain embodiments, comprises a compliant and/or elastomeric material. The dielectric layer 65 is desirably formed so as to extend between the lower side 55 of the base layer 52 and cover the molding material 35 and microelectronic element 10. The leads 58 are thereby embedded in the dielectric layer 65, as are the connections 63 between the second ends 64 and the protrusions 14. (See FIG. 8A). The terminal structures 56 are available on the upper side 53 of the base layer 52 for forming connections with external circuitry. For example, solder balls 68 may be formed on the terminal structures 56 so that the assembly 60 may be connected with a circuit board or other device.

Figure 8A:
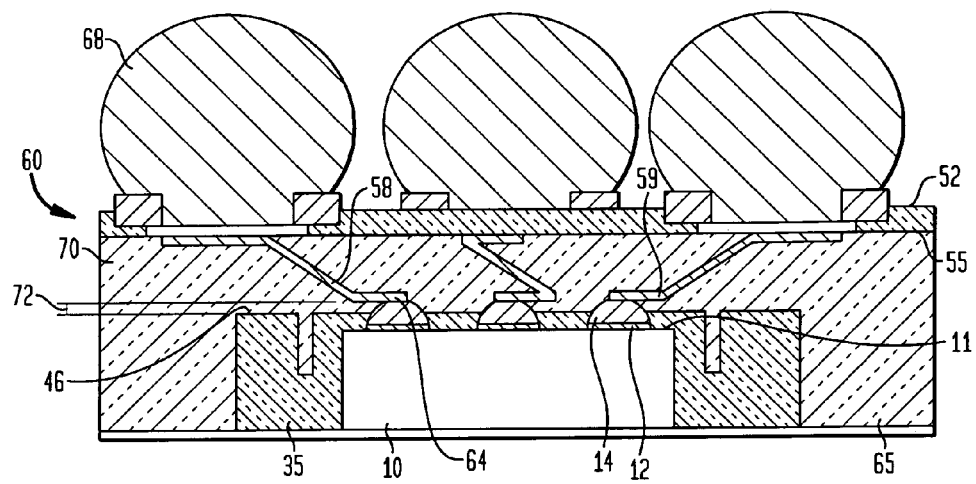
FIG. 8A is the cross-sectional view of FIG. 7 at a later state in a method in accordance with the embodiment of FIGS. 1–7.
Figure 8B:
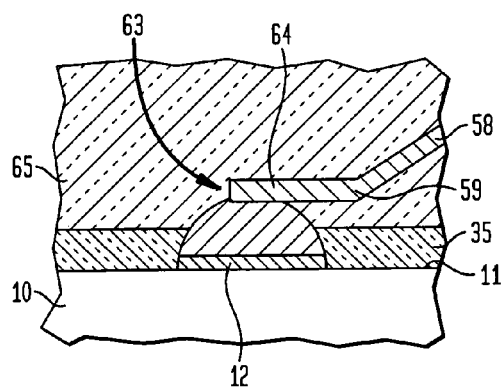
FIG. 8B is a detail of FIG. 8.
Figure 9:
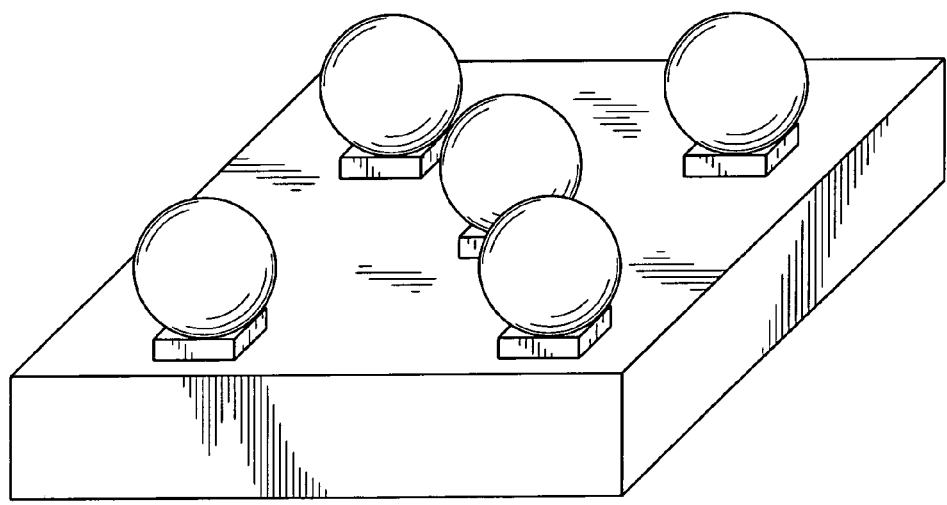
FIG. 9 is a top-right perspective view of an assembly in accordance with the embodiment of FIGS. 1–8.

During service, or other operations involving generating heat, the protrusions 14 interfere with the ability of the dielectric layer 65 to adapt, causing stress on the conductive elements. As shown in FIG. 8A, the dielectric layer 65 has a first portion 70 which incorporates the relatively narrow elongated portions of the leads 58. A second portion 72 of the dielectric layer 65 incorporates the protrusions 14. Due to the presence of the protrusions 14, the second portion 72 is less flexible or compliant than the first portion 70. The region 59 of the lead 58 lies on or adjacent to the boundary between the first portion 70 and second portion 72. The molding material 35 reduces the height of the protrusions 14 that are incorporated in the dielectric layer 65 of assembly 60.

The molding material 35 is selected so as to reduce the stress on the leads. In certain embodiments, the molding material comprises a material with a coefficient thermal expansion ("CTE") closer to the CTE of the microelectronic element 10, than the CTE for the dielectric component 65. The closer the CTE values for the microelectronic element 10 and the molding material 35, the less stress that is produced in the lead 58. Preferably, the CTE of the molding material substantially matches the CTE of the microelectronic element. In preferred embodiments, the molding material 35 comprises a material having a thermal conductivity sufficient to function as a heat spreader for the final assembly. In certain preferred embodiments, the distance between the second top surface 46 and the uppermost portion of the protrusions 14 is less than 50 μm. Methods according to embodiments of the invention include protrusions comprising C4 bumps having a significant height. The molding material effectively reduces the height of the portion of the C4 bump incorporated in the dielectric layer.

The microelectronic element 10 may comprise a semiconductor chip, a wafer incorporating a plurality of semiconductor chips, a circuit board, or any other microelectronic element. The microelectronic element 10 may comprise silicon. In such embodiments, the molding material 35 comprises a material having a CTE that is closer to the CTE for silicon, than the CTE for the dielectric layer 65. The molding material 35 may comprise an epoxy having a very low CTE.

Assemblies in accordance with embodiments of the present invention may be formed as discussed in certain embodiments of U.S. Pat. No. 5,518,964, the disclosure of which is hereby incorporated by reference herein. Such assemblies may incorporate certain features taught in certain embodiments of U.S. Pat. Nos. 5,798,286, 5,830,782, and 5,688,716, the disclosures of which are hereby incorporated by reference herein. Assemblies in accordance with certain embodiments of the present invention may also incorporate features disclosed in certain embodiments of U.S. Pat. No. 5,913,109 and U.S. patent application Ser. No. 09/271,688, filed Mar. 18, 1999, now U.S. Pat. No. 6,429,112, the disclosures of which are hereby incorporated by reference herein.

Removal of the molding material 35 to uncover at least a portion of the protrusions 14 may include grinding the first top surface 40 of the molding material 35. The molding material 35 may also be etched, using plasma etching or chemical etching of the first top surface 40 of the molding material 35. A combination of the foregoing methods may be used. In the embodiment of FIGS. 1–9, a portion of the molding material 35 is removed without substantially removing the protrusions 14. In certain embodiments, etching is employed, and the etchant used is selected so as to remove the molding material 35, without substantially removing the protrusions 14. The etching is stopped before all the molding material 35 is removed, producing a layer of molding material with protrusions protruding from the layer of molding material.

In certain embodiments of the present invention, the leads are not deformed into a vertically extensive configuration. A molding material is provided over the first surface of a microelectronic element and a portion of the molding material is removed to expose at least a portion of the protrusions on the microelectronic element. The microelectronic element is assembled with a microelectronic component and the leads are bonded to the protrusions on the microelectronic element. A dielectric layer is formed between the microelectronic component and the microelectronic element. The CTE of thermal expansion of the molding material is selected to reduce the stress on the leads. In other embodiments, the contacts of the microelectronic element are connected to conductive elements of a microelectronic component that have a form other than leads. The dielectric layer may incorporate materials that are compliant, elastomeric, or other materials.

Figure 10:
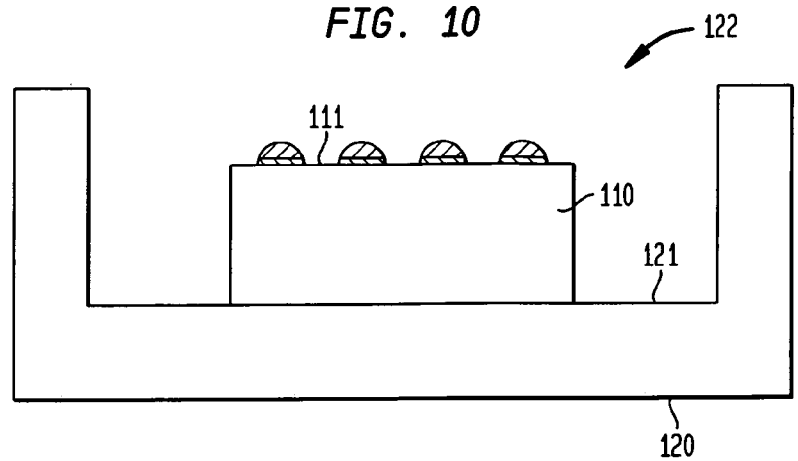
FIG. 10 is a cross-sectional view of a microelectronic element in a method in accordance with a further embodiment of the invention.

In a further embodiment, as shown in FIG. 10, the mold 120 supports the microelectronic element 110. The microelectronic element 110 is disposed in a recess 122 of the mold 120 so that a surface 121 of the mold 120 supports the microelectronic element 110. A molding material is applied over the first surface 111 and the microelectronic element 110 is assembled with a microelectronic component, substantially as disclosed above. The mold 120 may incorporate one or more protruding members, as discussed above.

Figure 11:
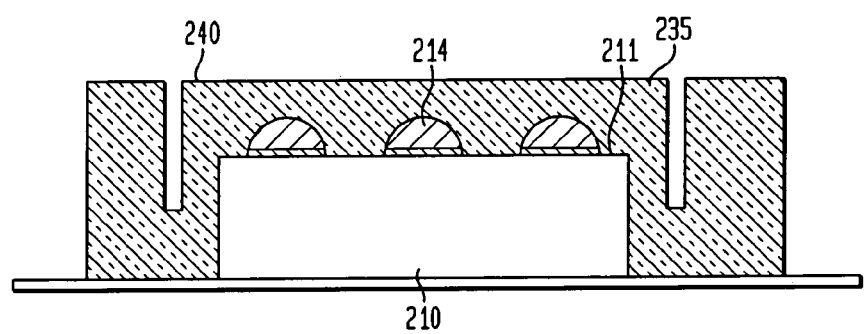
FIG. 11 is a cross-sectional view of a microelectronic element in a method in accordance with another embodiment of the invention.
Figure 12:
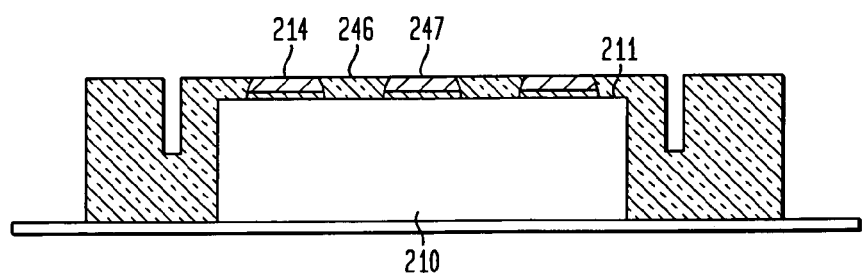
FIG. 12 is the cross-sectional view of FIG. 11, at a later stage in a method in accordance with the embodiment of FIG. 11.
Figure 13:
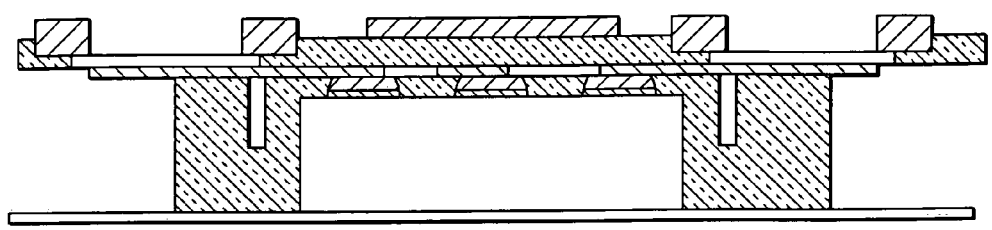
FIG. 13 is the cross-sectional view of FIG. 12, at a later stage in a method in accordance with the embodiment of FIGS. 11 and 12.
Figure 14:
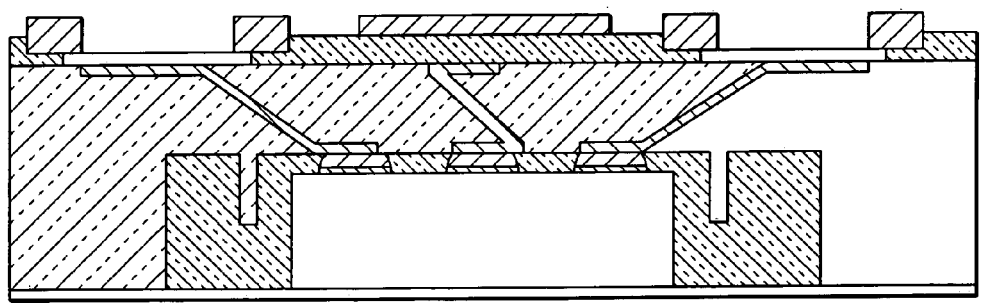
FIG. 14 is the cross-sectional view of FIG. 13, at a later stage in a method in accordance with the embodiment of FIGS. 11–13.

In other embodiments, a portion of the protrusions 214 are removed when the portion of the molding material 235 is removed. As shown in FIGS. 11 and 12, the molding material 235 is formed over the first surface 211 of the microelectronic element 210. The first top surface 240 of the molding material 235 is grinded down mechanically and the grinding process proceeds so as to remove a portion of the protrusions 214. The grinding process is stopped before the protrusions 214 are entirely removed and before damage to the first surface 211 of the microelectronic element 210 occurs. The grinding also forms a second top surface 246 for the molding material 235 that incorporates faces 247 of the protrusions 214, comprising the material which forms the bumps 214. Thus, the height of the protrusions 14 above the second top surface 246 is reduced to about zero. The faces 247 are used to connect to a microelectronic component and to form an assembly as shown in FIGS. 13 and 14, substantially as discussed above. In other embodiments, the first top surface 240 of the molding material 235 is etched and the etching continues so as to remove a portion of the protrusions 214.

In a further embodiment of the invention, a portion of the molding material 235 is removed to form a second top surface located between the upper-most portion of the protrusions 214 and the first surface 211. A portion of the protrusions 214 is then removed to form the faces 247 incorporated in the second top surface 246 or protruding from the second top surface of molding material. The process of removing the molding material and/or a portion of the protrusions may comprise grinding or etching, such as plasma etching or chemical etching. Where etching is used, the etchant is selected so that the etchant removes both the molding material 35 and the protrusions, or more than one etchant may be used to remove some of the molding material, and then remove portions of the protrusions.

Figure 15:
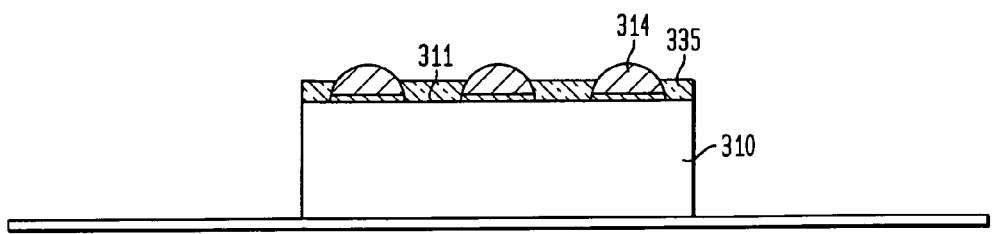
FIG. 15 is a cross-sectional view of a microelectronic element in a method in accordance with a further embodiment of the invention.
Figure 16:
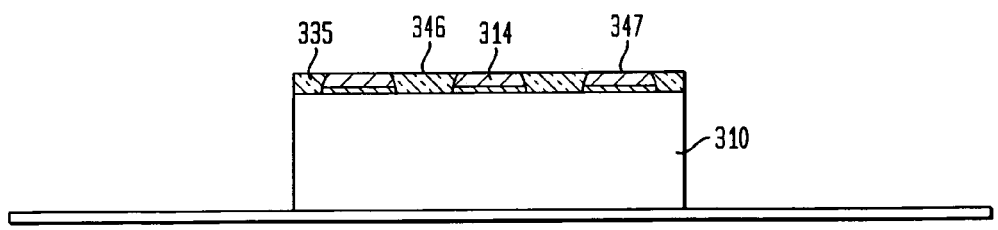
FIG. 16 is the cross-sectional view of FIG. 15, at a later stage in the method in accordance with the embodiment of FIG. 15.

In a further embodiment of the invention, the molding material 335 is disposed on the first surface 311 of the microelectronic element 310 so as to surround the protrusions 314 on the microelectronic element 310. The molding material 335 may be applied by coating the first surface 311 of the microelectronic element 310 with the molding material 335, such as by spin coating or dispensing molding material on the first surface, as shown in FIG. 15. Thus, although this material is called a "molding" material, this term as used herein means any material that is molded, cast, spun-on, or flooded on the first surface 311. The microelectronic element 310 may then be assembled with a microelectronic component, substantially as discussed above. In other embodiments, a portion of the protrusions 314 is removed after the molding material is disposed on the first surface 311 to form faces 347 incorporated in a surface 346 of the molding material 335, or protruding from a surface 346 of the molding material. (FIG. 16). In further embodiments, the molding material is applied so as to cover the protrusions. Then a portion of the molding material is removed or a portion of the molding material and the protrusions are removed so that the protrusions are accessible. A portion of the molding material may be removed separately from the removal of a portion of the protrusions. The removal of the molding material 335 and/or the portion of the protrusions 314 may be performed by grinding and/or etching, such as plasma etching or chemical etching.

Figure 17:
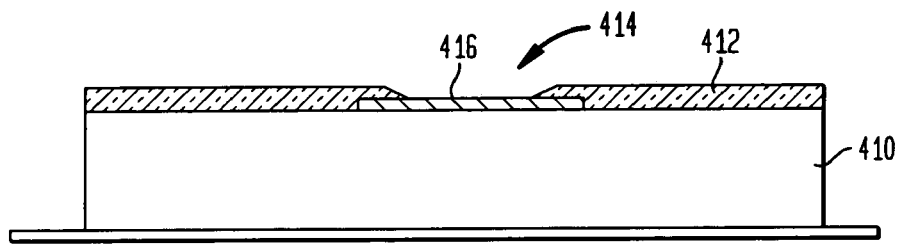
FIG. 17 is a cross-sectional view of a microelectronic element in a method in accordance with yet another embodiment of the invention.
Figure 18:
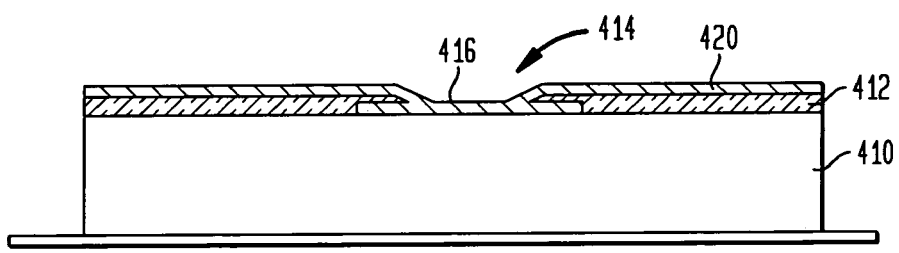
FIG. 18 is the cross-sectional view of FIG. 17, at a later stage in a method in accordance with the embodiment of FIG. 17.

In further embodiments, the microelectronic element 410 is provided with protrusions such as bumps 418 having a low-profile. The microelectronic element 410 is provided with a passivation layer 412 having apertures 414 aligned with the contacts 416 of the microelectronic element 410, as is known in the art. (FIG. 17). A metal layer is applied to the top of the passivation layer 412 so that the metal layer comes into contact with the contacts 416. The metal layer may comprise an under-bump metalization layer ("UBM") 420, or other layers to facilitate the use of solder or other bonding materials in conjunction with the contacts 416. For example, certain UBM layers are used in conjunction with aluminum contact pads, as is known in the art. The UBM layer may be formed by evaporating layers of chromium, copper and gold, and alloys of the foregoing.

Figure 19:
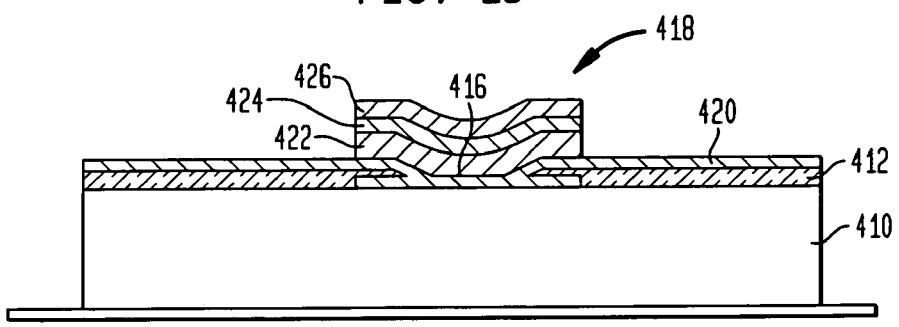
FIG. 19 is the cross-sectional view of FIG. 18, at a later in a method in accordance with the embodiment of FIGS. 17 and 18.
Figure 20:
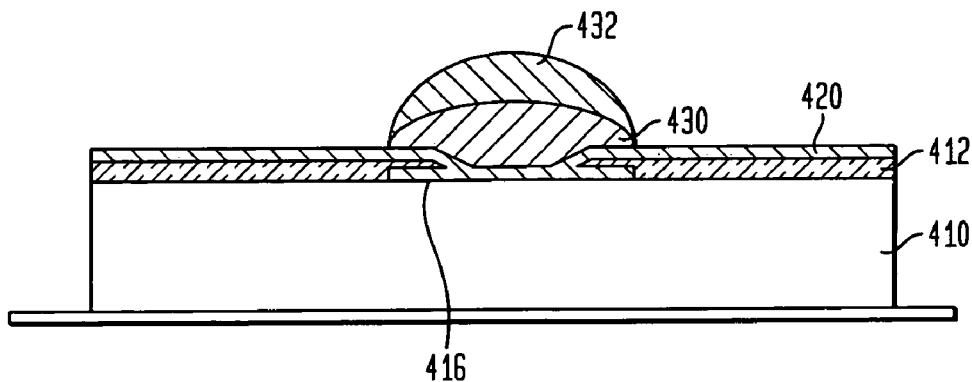
FIG. 20 is the cross-sectional view of FIG. 19, at a later stage in a method in accordance with the embodiment of FIGS. 17–19.
Figure 21:
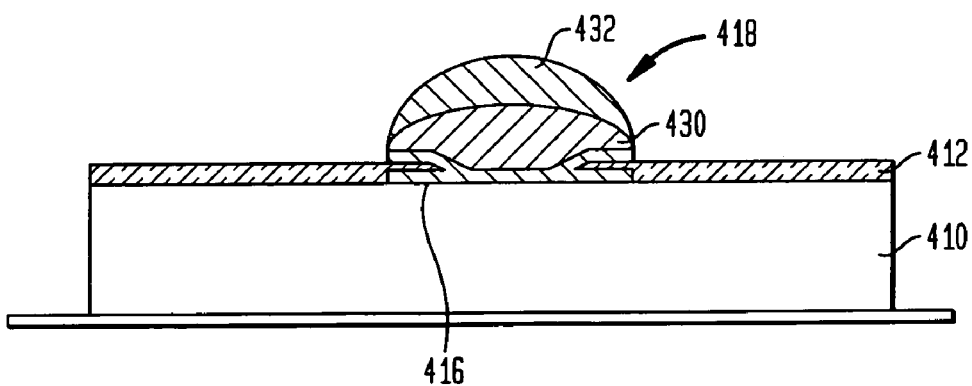
FIG. 21 is the cross-sectional view of FIG. 20, at a later stage in a method in accordance with the embodiment of FIGS. 17–20.

A bump 418 is then formed by depositing a plurality of conductive layers on the UBM layer 420. As shown in FIG. 19, a first conductive layer 422 is deposited on the UBM layer 420, in the region aligned with the contact 416. A second conductive layer 424 is then deposited over the first layer 422. A third conductive layer 426 is then deposited on the second conductive layer 424. In a preferred embodiment, the UBM layer 420 of chromium, copper and gold is deposited over the passivation layer 412 and on the contacts 416. Then a first conductive layer 422 of high lead solder is deposited on the UBM layer, in the region of the contact 416. For example, a layer of 97Pb3Sn is deposited by evaporation or electroplating to form the first conductive layer 422. A second conductive layer 424 of pure lead is deposited on the first conductive layer 422 by evaporation or electroplating. The third conductive layer 426 of pure tin is also deposited by evaporation or electroplating. The conductive layers may be deposited in the area of the contacts 416 by using well-known techniques, such as photolithographically patterned masks.

The thicknesses of the layers may vary, as is known in the art. Merely by way of example, a first conductive layer 422 of high lead solder may have a thickness of about 20 micrometers, the second conductive layer 424 of lead may have a thickness of about 6.6 micrometers and the third conductive layer 426 of tin may have a thickness of about 17 micrometers. A reflow process utilizing heat melts the conductive layers to form a bump 418 of bonding material. Regions of the UBM layer 420 that are not covered by the bump 418 are removed. The bump consists of a core 430 of high lead solder and an outer bump layer 432 of eutectic material on the outside of the core 430. In this example, a 25 micrometer high outer bump layer 432 is formed on a 20 micrometer high core 430.

The entire bump 418 is preferably less than 50 micrometers in height and has a core 430 that is less than 25 micrometers in height. More preferably, the core 430 has a height of between about 5 micrometers to about 25 micrometers and the outer bump layer 432 has a height of between about 5 micrometers to about 25 micrometers. The UBM layer may comprise a layer having a thickness of between about 5 micrometers and about 25 micrometers.

Figure 22:
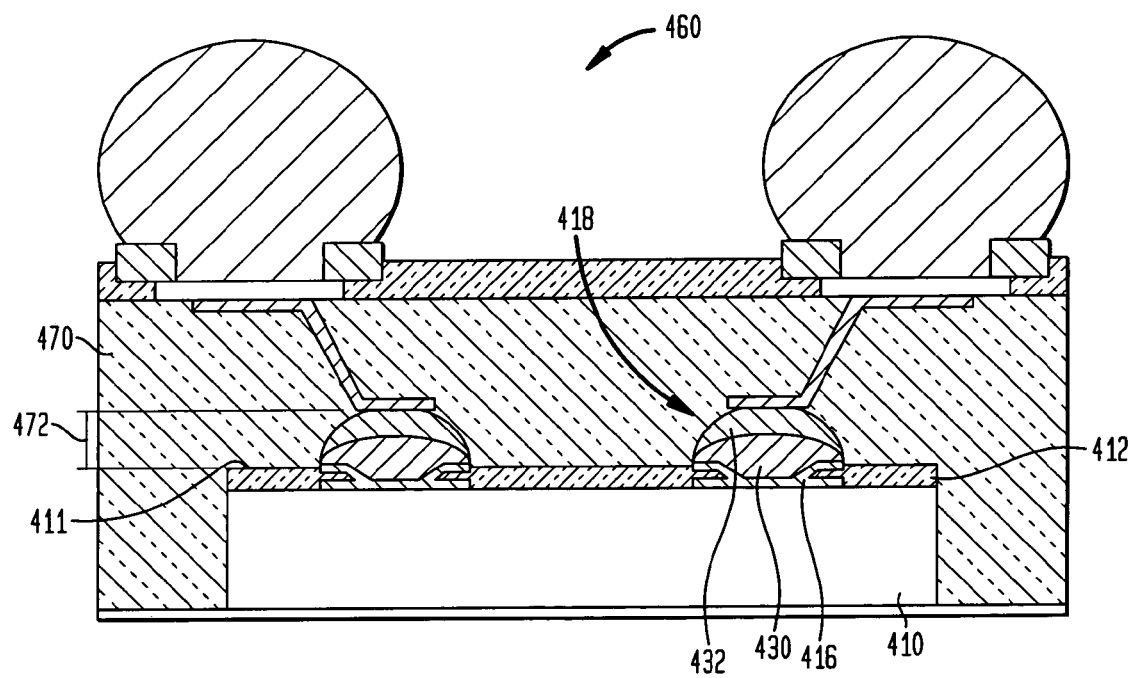
FIG. 22 is the cross-sectional view of FIG. 21, at a later stage in a method in accordance with the embodiment of FIGS. 17–21.

The bump 418 is then used to make a connection with a microelectronic component to form an assembly 460, such as the assembly 460 shown in FIG. 22. The assembly 460 includes a dielectric layer 465 overlying a first surface 411 of the microelectronic element 410. Utilizing the low profile bump discussed above, the second portion 472 of dielectric layer 465 incorporating the bumps 418 comprises a lesser portion of the dielectric layer 465 overlying the first surface 411. As a result, the stress on the conductive elements of the assembly that extend through the dielectric layer 465 is reduced.

In a further example, the UBM layer comprises titanium, copper, nickel, and alloys thereof, the first conductive layer comprises high lead solder, the second conductive layer comprises pure lead, and the third conductive layer comprises pure tin. In a further example, 10 micrometers of 97Pb3Sn is deposited as the first conductive layer, 3.3 micrometers of pure lead is deposited as the second conductive layer, and 8.5 micrometers of pure tin is deposited as the third conductive layer. After reflow, the bump has a 10 core and an 11.5 micrometer outer bump layer. The total height is about 21.5 micrometers.

In another preferred embodiment, high lead solder is deposited on the UBM layer and a eutectic material is applied to the core to form a bump over a contact. The eutectic material may be applied by dip coating. Preferably, the core has a height of between about 5 to 25 micrometers and the dipped coating has a height of between about 15 to 25 micrometers. In any of the embodiments discussed above, the metal layers may be applied using either dipping, evaporation or electroplating.

The low-profile bumps discussed above may be used for any microelectronic element.

Figure 23:
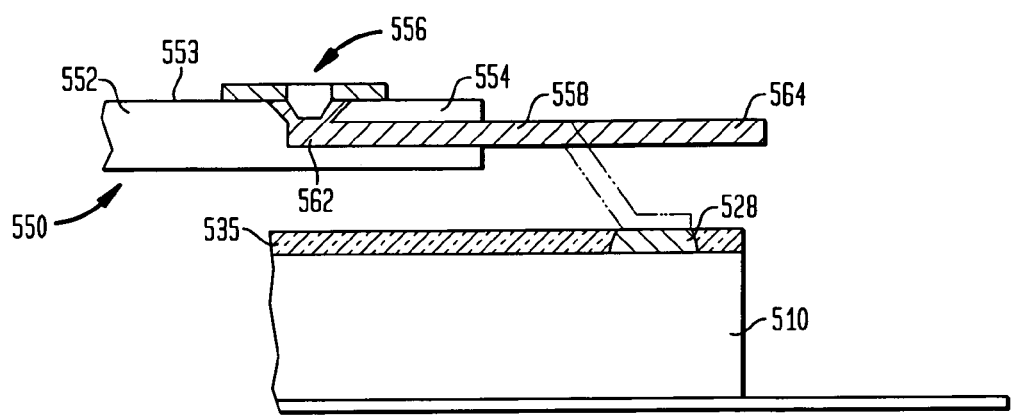
FIG. 23 is a cross-sectional view of a microelectronic element in a method in accordance with another embodiment of the invention.
Figure 24:
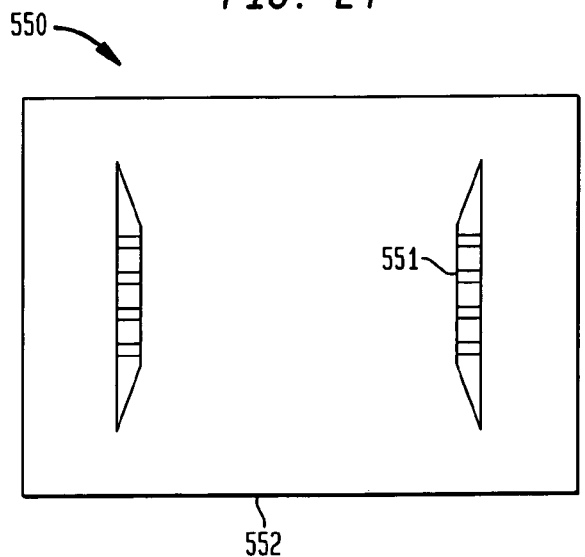
FIG. 24 is a top plan view of a component in a method in accordance with the embodiment of FIG. 23.

In another embodiment, as shown in FIGS. 23 and 24, a microelectronic element 510 having protrusions 528 of bonding material is assembled with a microelectronic component 550 having conductive elements 554. The conductive elements 554 comprise leads 558 which are incorporated in the base layer 552 of the component 550 at a first end 562. The base layer 552 may comprise a sheet having one or more bond windows 551. The leads 558 extend from the base layer 552 so that second ends 564 are either free from the base layer 552 or detachable therefrom. The leads 558 are bonded to the protrusions 528 in an operation that involves forcing the leads downwardly so that the second ends 564 come into contact with the protrusions 528. In the embodiment shown, bonding material is used and reflowed to form the connection with the lead 558. The height of the bonding material is not a concern because the molding material 535 reduces the height of the bonding material, as discussed above. A dielectric layer is formed around the leads. Thus, embodiments of the present contemplate the formation of many different kinds of microelectronic assemblies.

In further embodiments of the invention, an assembly is formed as disclosed in certain embodiments of International Publication No. WO 92/05582, and. U.S. Pat. Nos. 5,148, 266 and 5,148,265, the disclosures of which are hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of making a microelectronic assembly, comprising:
   a) providing a microelectronic element having a first major surface with protrusions projecting from the first major surface;
   b) covering the first major surface and the protrusions with a material;
   c) removing a portion of the material so that portions of the protrusions are accessible; and
   d) after the removing step and while the protrusions are accessible, assembling the microelectronic element with a microelectronic component.

2. The method of claim 1, wherein the protrusions comprise bumps of bonding material.

3. The method of claim 2, wherein the protrusions comprise a solder selected from the group consisting of high lead solder, C4 solder and eutectic solder.

4. The method of claim 1, wherein the material comprises an epoxy.

5. The method of claim 1, wherein the material has a low coefficient of thermal expansion.

6. The method of claim 1, wherein the protrusions project from the material a distance of about 50 µm or less.

7. The method of claim 1, wherein the step of covering the first major surface and the protrusions comprises:
   a) disposing the microelectronic element in the recess of a mold tool so that the first major surface is disposed in the recess; and
   b) disposing the material in the recess so as to cover the first major surface.

8. The method of claim 7, wherein the recess is defined by a base, a wall extending from the base, and an open side.

9. The method of claim 8, wherein the mold tool has at least one protruding member extending from the base into the recess, the at least one protruding member being spaced from the wall.

10. The method of claim 9, wherein the at least one protruding member defines an inner region within the recess and the first major surface is disposed in the inner region.

11. The method of claim 10, wherein the material is disposed in the recess so that the first major surface and the protrusions are covered by the material.

12. The method of claim 11, wherein the material is disposed in the recess so that, after removing the mold tool, the at least one protruding member leaves at least one groove in the material.

13. The method of claim 1, wherein the material is applied to the first major surface as a flowable, curable material and cured to a relatively rigid material.

14. The method of claim 1, wherein the portion of the material is removed by grinding.

15. The method of claim 1, wherein the portion of the material is removed by etching.

16. A method of making a microelectronic assembly, comprising:
   a) providing a microelectronic element having a first major surface with protrusions projecting from the first major surface;
   b) covering the first major surface and the protrusions with a material;
   c) removing a portion of the material so that portions of the protrusions are accessible; and
   d) assembling the microelectronic element with a microelectronic component wherein the step of removing a portion of the material includes removing a portion of the protrusions.

17. The method of claim 16, wherein the step of removing a portion of the material forms a surface of material incorporating at least one surface of the protrusions.

18. The method of claim 17, wherein the step of removing a portion of the material comprises removing a portion of the material so that portions of the protrusions project from the material and further comprising removing the portions of the protrusions.

19. The method of claim 1, further comprising interconnecting the protrusions of the microelectronic element with conductive elements of the microelectronic component.

20. The method of claim 19, wherein the microelectronic component comprises a base layer and the conductive elements comprise leads, each of the leads having a first end and a second end.

21. The method of claim 20, wherein the first ends of the leads are connected to the microelectronic component adjacent a lower surface of the base layer.

22. The method of claim 21, wherein the step of interconnecting comprises bonding the second ends of the leads to the protrusions of the microelectronic element.

23. The method of claim 22, further comprising deforming the leads so that the leads extend between the microelectronic component and the microelectronic element.

24. The method of claim 23, further comprising forming a dielectric layer extending between the microelectronic component and the microelectronic element so that the leads are embedded in the dielectric layer.

25. The method of claim 24, wherein the step of forming a dielectric layer includes introducing a flowable material between the microelectronic component and the microelectronic element.

26. The method of claim 24, wherein the coefficient of thermal expansion for the molding material is closer in value to the coefficient of thermal expansion of the microelectronic element than the coefficient of thermal expansion for the dielectric layer.

27. The method of claim 20, wherein the microelectronic component has conductive elements comprising leads, and further comprising deforming the leads so that the leads are brought into engagement with the protrusions.

28. The method of claim 1, further comprising:
   a) connecting the protrusions to conductive elements of the microelectronic component; and
   b) forming a dielectric layer over the first major surface so as to surround the conductive elements.

29. The method of claim 28, wherein the coefficient of thermal expansion of the material is closer in value to the coefficient of thermal expansion of the microelectronic element than the coefficient of thermal expansion of the dielectric layer.

30. A method of forming protrusions on a microelectronic element, comprising:
   a) providing a semiconductor chip having a first major surface and contacts exposed at the first major surface; and
   b) forming protrusions including applying a first conductive layer over the contacts, and a second conductive layer on the first conductive layer, wherein the first conductive layer comprises an alloy including lead and tin;
   c) wherein the protrusions project 50 μm or less from the first major surface.

31. The method of claim 30, wherein at least one of the first conductive layer and second conductive layer comprises bonding material.

32. The method of claim 31, wherein the first conductive layer comprises a high lead solder and the second conductive layer comprises eutectic solder.

33. The method of claim 32, wherein the first conductive layer has a height between about 5 μm and about 25 μm and the second conductive layer has a height between about 10 μm and about 25 μm.

34. The method of claim 30, wherein the step of applying a second conductive layer comprises dipping.

35. The method of claim 30, including applying a third conductive layer on the second conductive layer.

36. The method of claim 35, wherein the first conductive layer comprises a high lead solder, the second conductive layer comprises lead and the third conductive layer comprises tin.

37. The method of claim 36, further comprising reflowing the first conductive layer, second conductive layer and third conductive layer to form a protrusion having a core and an outer layer, the core comprising a high lead alloy and the outer layer comprising an eutectic layer.

38. The method of claim 30, further comprising applying an initial layer on at least a portion of the first major surface so that the initial layer is in contact with the contacts, before the step of applying the first conductive layer.

39. The method of claim 38, wherein the initial layer comprises at least one metal selected from the group consisting of chromium, copper, titanium, nickel, gold, and alloys of chromium, copper, titanium, nickel and gold.

40. A method of forming a microelectronic chip package, comprising the method of forming protrusions according to claim 30, further comprising providing a connection component having conductive elements, interconnecting the protrusions with the conductive elements, and forming a dielectric layer extending between the microelectronic component and the microelectronic element so that the protrusions and the conductive elements are at least partially embedded in the dielectric layer.

* * * * *